(12) United States Patent
White et al.

(10) Patent No.: US 6,611,147 B2
(45) Date of Patent: Aug. 26, 2003

(54) APPARATUS WITH INTERCHANGEABLE MODULES FOR MEASURING CHARACTERISTICS OF CABLES AND NETWORKS

(75) Inventors: Charles Michael White, Escondido, CA (US); William L. Redman, San Diego, CA (US); S. Stanley Mintz, Cardiff, CA (US); Kwok Lo, San Diego, CA (US); Jarek Kanikula, Carlsbad, CA (US); Mark William Borneman, San Diego, CA (US)

(73) Assignee: IDEAL Industries, Inc., Sycamore, IL (US)

( * ) Notice: Subject to any disclaimer, the term of this patent is extended or adjusted under 35 U.S.C. 154(b) by 2 days.

(21) Appl. No.: 09/863,810

(22) Filed: May 22, 2001

(65) Prior Publication Data

US 2002/0175689 A1 Nov. 28, 2002

(51) Int. Cl.$^7$ ............... H01H 31/02; H01H 31/04; G01R 27/28
(52) U.S. Cl. ............. 324/539; 324/538; 324/628
(58) Field of Search .................. 324/628, 539, 324/540, 642, 555, 754, 755, 765, 538; 702/79

(56) References Cited

U.S. PATENT DOCUMENTS

| | | | |
|---|---|---|---|
| 5,539,321 A | 7/1996 | Sciacero et al. | |
| 5,677,633 A | 10/1997 | Moser et al. | |
| 5,821,760 A | 10/1998 | Koeman et al. | |
| 5,896,037 A | * 4/1999 | Kudla et al. ........... 324/755 |

* cited by examiner

*Primary Examiner*—N. Le
*Assistant Examiner*—James C. Kerveros
(74) *Attorney, Agent, or Firm*—Cook, Alex, McFarron, Manzo, Cummings & Mehler, Ltd.

(57) ABSTRACT

A test apparatus for performing line testing of cable and networks. In one embodiment, the test apparatus includes a housing configured to electrically connect with an adapter module while minimizing bends in the electrical connection. The housing and adapter module include mating connectors configured to provide a direct connection between the adapter module and the housing. One embodiment includes a guide feature to ease the insertion of the adapter module into the housing. In another embodiment, the adapter module is configured to form a continuous surface with the housing upon its insertion.

72 Claims, 8 Drawing Sheets

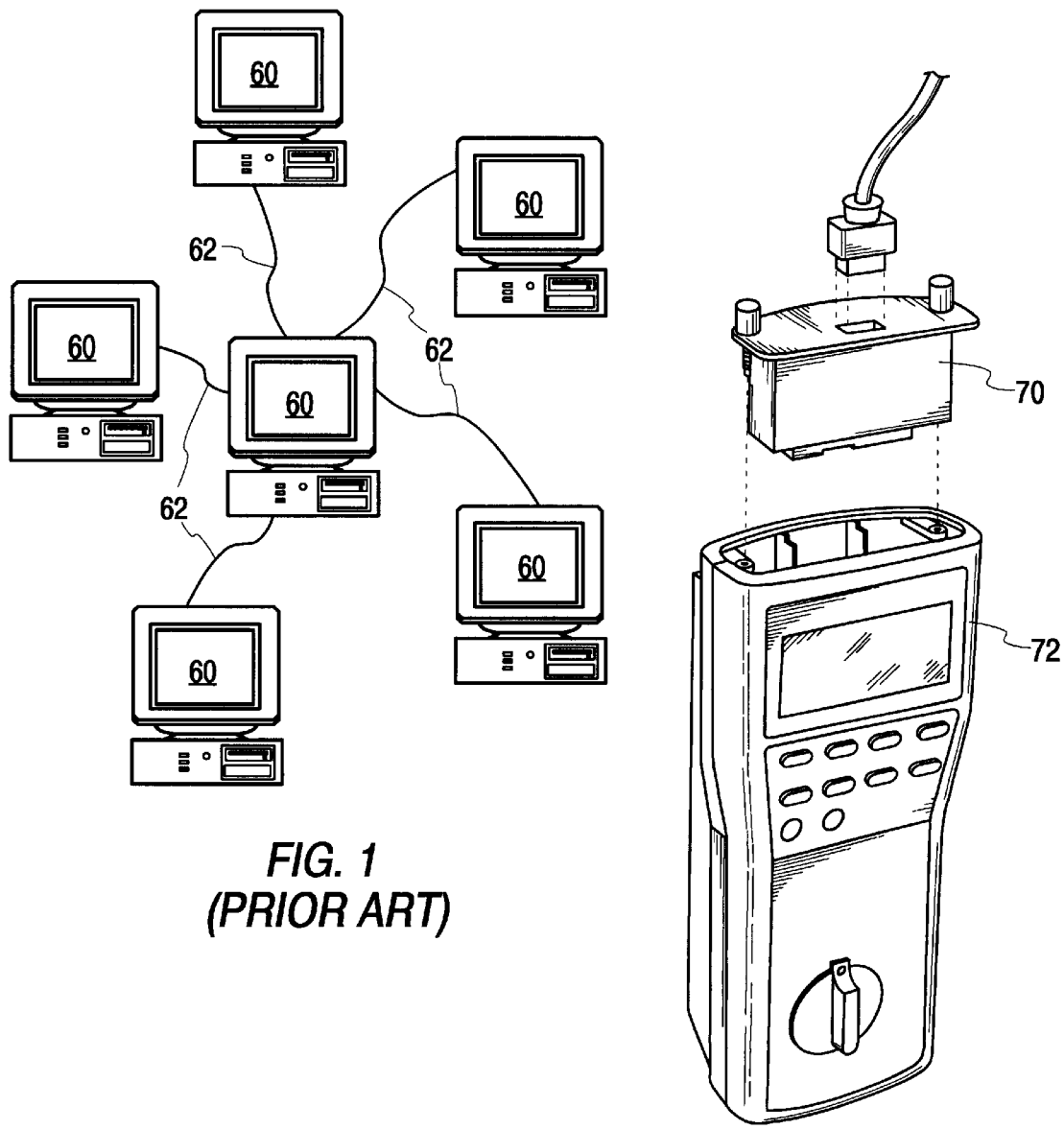
FIG. 1
*(PRIOR ART)*
FIG. 2
*(PRIOR ART)*
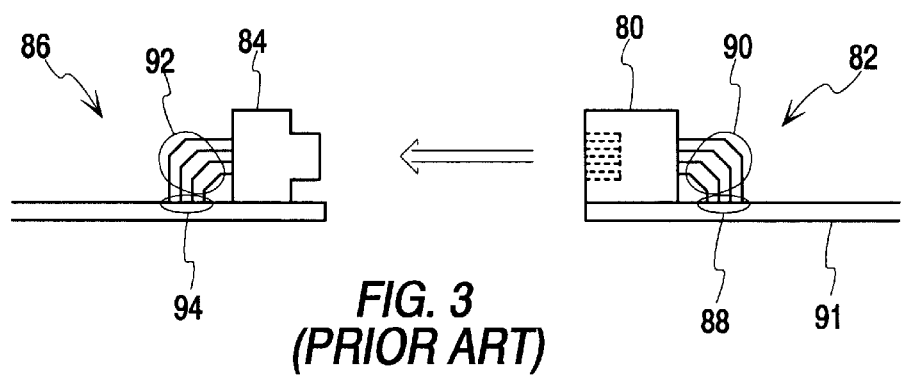
FIG. 3
*(PRIOR ART)*

APPARATUS WITH INTERCHANGEABLE MODULES FOR MEASURING CHARACTERISTICS OF CABLES AND NETWORKS

BACKGROUND OF THE INVENTION

1. Field of the Invention

The invention relates to test instruments, and more specifically to test instruments for the testing of local area network cables.

2. Description of the Related Art

High-speed data transmission cables are often an integral part of computer networks and telecommunication systems. A local area network (LAN), for example, as illustrated in FIG. 1 will usually include a number of individual computers and peripheral devices 60 communicating to one another through data cables 62. The performance of the network can be affected by the quality of the data cables 62, therefore it is important to test the cables to ensure the network is configured correctly. A number of companies have developed hand-held test instruments that allow network installers to quickly and accurately test the cables used to construct the LAN. These test instruments must be electrically reliable under field cable installer and cable test conditions. It is desirable for the instruments to allow for ready replacement in the field of the cable test connector, which, in the case of LAN cables is the RJ-45 connector. The instruments must be mechanically rugged, reliable, and professional in appearance.

LAN's are generally constructed of a twisted wire cable containing a number of twisted wire pairs. Existing handheld test instruments will run a battery of tests to evaluate the performance and connections of each of the twisted wire pairs within each cable. Representative tests performed by the test instruments include cross talk, attenuation, length of the cable, and noise. Each of these tests relies on the measurement of a high frequency (RF) signal which is transmitted through the wire pair. The actual RF measurements in the test instrument typically take place on an RF measurement Printed Circuit Board (PCB).

Some known test instruments separate the test hardware into a main unit and a performance/adapter module such as the instrument disclosed by Moser et al, U.S. Pat. No. 5,677,633, entitled "Cable Test Instrument Having Interchangeable Performance Modules." The performance/adapter module is an interchangeable module having a compatible connector for attachment to the main unit and a cable connector for attachment to a cable being tested. The above described instrument configuration allows the test instrument to be connected to a variety of different LAN cables by simply replacing the performance/adapter module.

The prior art experiences limitations when the test equipment is separated into two pieces of hardware, as described above and illustrated in FIG. 2. The test equipment illustrated in FIG. 2 includes an adapter housing 70 and a main housing 72 designed to receive the adapter housing 70. The adapter housing 70 and the main housing 72 each include a mating connector. Upon insertion of the adapter housing 70 into the main housing 72, the mating connectors engage one another to form electrical and mechanical connections whereby electrical signals are communicated between the main housing 72 and the adapter housing 70. This connection is often inadequate to provide a reliable electrical and mechanical connection which is necessary for LAN testing. Due to the orientation of the connectors there may be misalignment when inserting the adapter housing 70 into the main housing 72 which could possibly damage the connectors. Moreover, misalignment between the mating connectors can also produce discontinuities in the electrical connection from one piece of the test equipment to the other.

A shroud may be used to lock the adapter housing 70 into the main housing 72. However, this configuration additionally requires a user to engage the connectors while being visually blocked from observing any potential misalignment between the two connectors. Furthermore, if the shroud does not adequately constrain the connector locations just prior to connector mating, the connectors may be damaged by any misalignment. When a straight-in connection orientation is used between the main housing 72 and the adapter housing 70, as illustrated in FIG. 2, strain can be placed on the mechanical connection from excessive movement or pull on the adapter if the adapter housing 70 is not locked securely into the main housing piece. As a result of this strain on the mechanical connection, the electrical connection between the adapter housing 70 and the main housing 72 may degrade over time and become unsuitable for providing accurate test measurements.

In addition to misalignment in the connectors, some prior art designs create a lever arm due to the orientation of the mechanical interface between the mating connectors of an adapter housing and of a main instrument housing when the adapter housing protrudes beyond the outer surface of the main housing. This lever arm puts additional strain on the electrical connection and may therefore affect the accuracy of the measurements being performed.

An additional problem experienced with designs where the test equipment is separated into two pieces is that the test signal must propagate through two printed circuit board's ("PCB") instead of a single PCB. These PCB's are typically connected from one module to another with a right angle connector on each module. Bends in the propagation path of an RF signal greatly affect the signal properties. These approximate right angle bends due to the use of a right angle connector introduce discontinuities in the characteristic impedance of the connection in addition to the discontinuity of the connector itself.

As illustrated in FIG. 3, the use of a right angle connector 80 in a removable cable adapter assembly 82 and a mating connector 81 in a main instrument housing 86 in the prior art may introduce at least four right angle bends. Two of these right angle bends are at areas 88 and 90 on the removable cable adapter assembly 82. The first right angle bend 88 consists of horizontal board traces from a PCB 91 meeting the connector via a right angle. The second right angle 90 is either a full right angle or a short radius that is part of the connector 80. The right angles 88, 90 in the cable adapter assembly are mirrored in the main instrument housing by a third and fourth right angles 92, 94, adding to the signal measurement degradation.

In addition to the impedance disruptions caused by these bends in the signal path, the areas of the second and third right angles 90, 92 are not fully shielded. This leads to undesired cross talk between signal pairs. These errors contribute additional error in instrument test measurements.

It will be appreciated that the electrical and mechanical connection orientations of present test instruments in the field limit the accuracy and reliability of the tests performed on a cable. The electrical limitations become more apparent at higher test frequencies and the mechanical limitations lead to reliability issues. It would therefore be advantageous to develop a test instrument with improved electrical and mechanical connection orientations to provide a more secure connection between a main housing piece and an adapter housing piece and to increase accuracy of cable test measurements.

SUMMARY OF THE INVENTION

The systems and methods of the present invention have several features, no single one of which is solely responsible for its desirable attributes. Without limiting the scope of this invention as expressed by the claims which follow, its more prominent features will now be discussed briefly. After considering this discussion, and particularly after reading the section entitled "Detailed Description of the Invention" one will understand how the features of this invention provide several advantages over traditional test instruments.

One aspect of the present invention is an apparatus for performing testing of local area network cables. The apparatus comprises an adapter module having a cable or connector located proximate to one end, a first printed circuit board connected to the adapter module to form a first wire connection, and a first connector connected to the first printed circuit board on a first surface of the first printed circuit board. The first connector includes a mating surface which is substantially parallel to the first surface of the first printed circuit board, and wherein there are substantially no bends in an electrical path from the first wire connection to the first mating surface. The apparatus further comprises a main instrument housing having an internal recess configured to receive the adapter module, a second printed circuit board connected to the housing to form a second wire connection, and a second connector connected to the second printed circuit board on a second surface of the second printed circuit board. The second connector includes a second mating surface which is parallel to the second surface, and wherein there are substantially no bends in an electrical path from the second wire connection to the second mating surface. The first connector engages the second connector on the first and second mating surfaces upon insertion of the adapter module into the main instrument housing.

Another aspect of the invention is a method of manufacturing a cable test instrument. The method comprises connecting a first printed circuit board having a first surface to a first connector having a first mating surface such that the first mating surface is substantially parallel to the first surface of the first printed circuit board. The method further comprises inserting the first printed circuit board and first connector in an adapter housing. The adapter housing is connected to a cable or connector located proximate to one end. The method further includes connecting a second printed circuit board having a second surface to a second connector having a mating surface such that the second mating surface is parallel to the second surface of the second printed circuit board. A main instrument housing is provided having an internal recess configured to receive the adapter housing. Finally, the second printed circuit board and the second connector are inserted in the main instrument housing such that the first connector engages the second connector on the first and second mating surfaces upon insertion of the adapter housing into the main instrument housing.

BRIEF DESCRIPTION OF THE DRAWINGS

FIG. 1 is a block diagram illustrating an exemplary layout of a LAN.

FIG. 2 is a perspective view illustrating the orientation of an adapter module during insertion into a handset module of a prior art test instrument.

FIG. 3 is a side view of the PCB assembly of a prior art adapter module to a PCB assembly of a main instrument housing.

DETAILED DESCRIPTION OF THE INVENTION

The invention is best described in reference to the Figures wherein like elements are designated with like numerals throughout.

Figure 4:
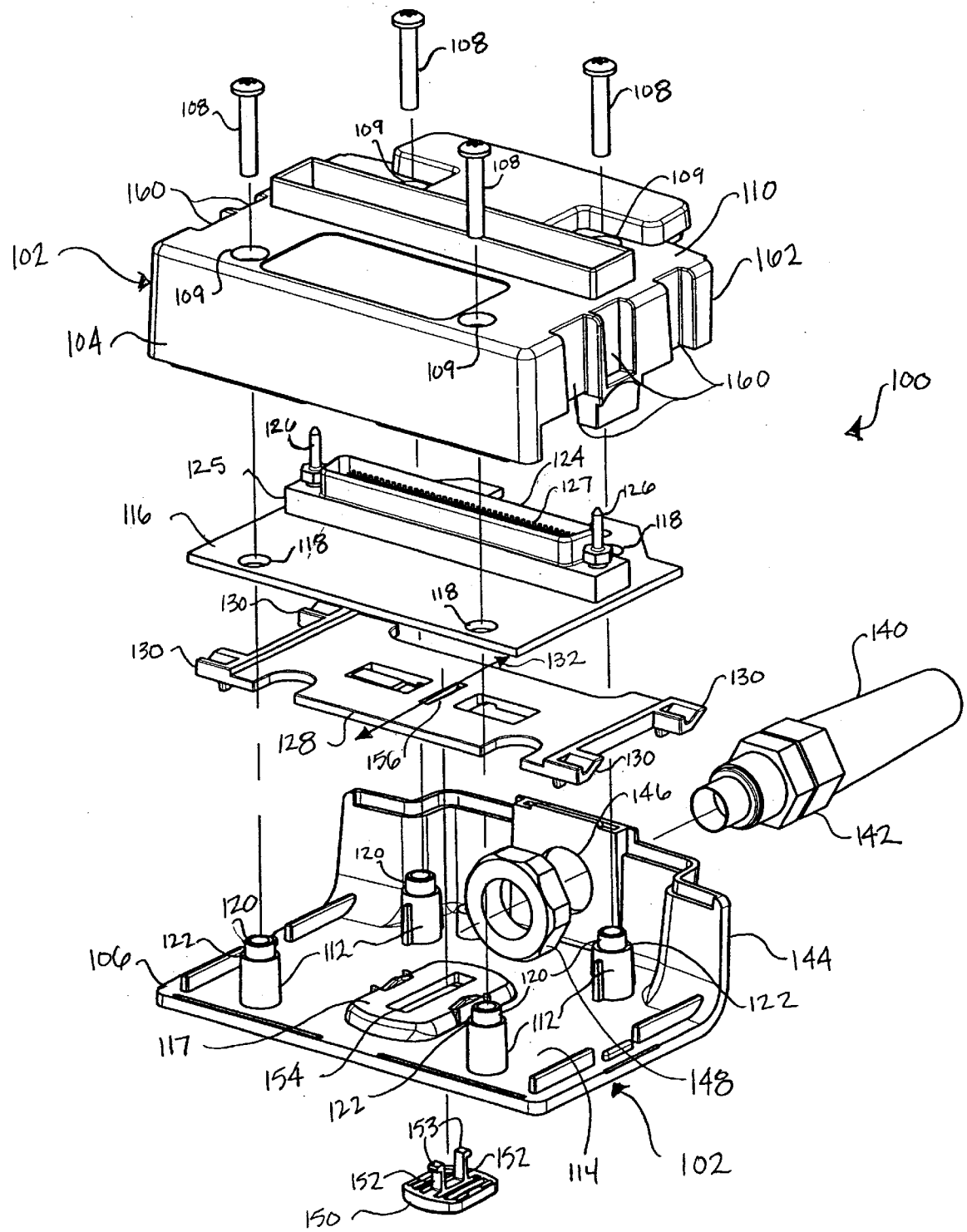
FIG. 4 is a perspective view illustrating an adapter module assembly stack of the invention.

Referring initially to FIG. 4, an assembly stack configuration of an adapter module 100 is shown for use as a plug in assembly for a cable test instrument. The module 100 includes an adapter housing 102 that is comprised of an inner cover 104 and outer cover 106 to shield enclosed electronics. The inner cover 104 is secured to the outer cover 106 by four securing screws 108. The four securing screws 108 pass through holes 109 in an upper face 110 of the inner cover 104 and extend outward to be received in one of four receivers 112 located on an inner surface 114 of the outer cover 106.

A PCB 116 includes apertures 118 through which the securing screws 108 extend. When securing screws 108 are received and tightened into fixed position within the receivers 112, an upper portion 120 of each receiver 112, having a reduced diameter from that of the rest of the receiver 112, extends through each aperture 118. The location where the upper portion 120 connects to the rest of the receiver 112 forms a shoulder 122. The shoulder 122 applies force to the PCB 116, urging it into contact with a shoulder (not shown) within the inner cover 104 so as to secure the PCB 116 in position. The PCB 116 includes a straight through RF connector 124 connected to the PCB 116 using any of the connection methods known to those in the art. The RF connector 124 includes a connector housing 125 which contains electrical contacts (not shown). These contacts provide an electrical connection from the PCB 116 to a mating connector (not shown). Located on the connector housing 125 are locating pins 126 for use in alignment of the mating connector with a first mating surface 127 which will be discussed further hereafter. The mating surface 127 is substantially parallel with the PCB 116.

Located below the PCB 116 is a latch 128 with locking tabs 130. The latch 128 is secured in the adapter housing 102 by contact forces between the inner surface 114 of the outer cover 106 and an inner edge surface (not shown) of the inner cover 104 when the inner and outer covers 104, 106 are assembled with the securing screws 108. The latch 128 is moveable in direction 132 such that the locking tabs 130 can be moved into and out of a locking position by a means discussed hereafter. Cable strain relief is provided by a pliable sleeve 140 and a more rigid strain relief apparatus 142 through which a cable can be connected to the adapter module 100. The strain relief apparatus 142 extends through opening 146 in a wall 144 of the outer cover 106 and is fastened against wall 144 by a strain relief nut 148.

A locking button 150 includes prongs 152 which extend from the locking button 150 and towards the latch 128. Attached to each prong 152 is a lip 153. The locking button 150 contacts an outer surface (not shown) of the outer cover 106 while the prongs 152 extend through a slot 154 in the outer cover 106. The prongs 152 further extend through a slot 156 in the latch 128 whereby each lip 153 contacts a surface of the latch 128. The lips 153 and prongs 152 apply an outward force to the latch 128 which secures the locking button 150 to the latch 128. Once secured, the position of the locking button 150 controls the position of the locking tabs 130. In the embodiment shown in FIG. 4, the locking button 150 is moveable with respect to the outer cover 106 in the same direction 132 as the latch 128 in order to control the position of the locking tab 150 with respect to the locking position. The locking mechanism will be described further hereafter with respect to FIGS. 5A and 5B.

The locking button on the adapter can be any kind of sliding or toggle locking mechanism that uses fixed tabs, ridges, or sockets on or in the adapter well in the handset and a sliding mechanism in the adapter housing.

Still referring to FIG. 4, the adapter housing 102 is also equipped with vertical guide wells 160 on outer side surfaces 162 of the inner cover 104 to ensure alignment when the adapter module 100 is inserted into a main handset as will be discussed further hereafter.

Figure 5A:
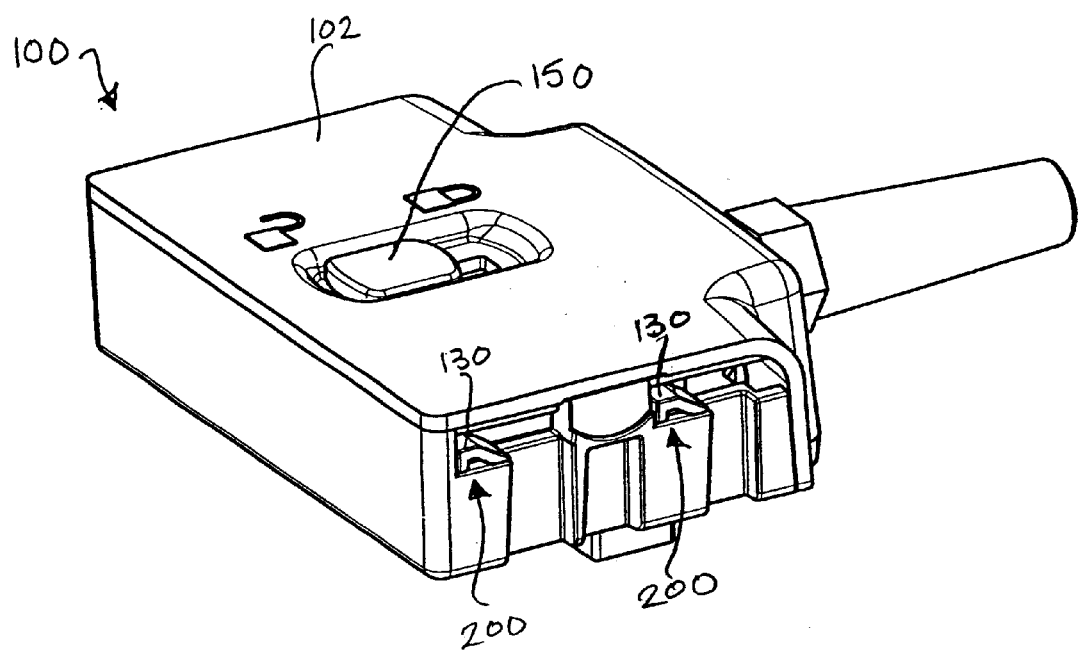
FIG. 5A is a perspective view illustrating the adapter module of FIG. 4, and showing the locking tabs in an open position.
Figure 5B:
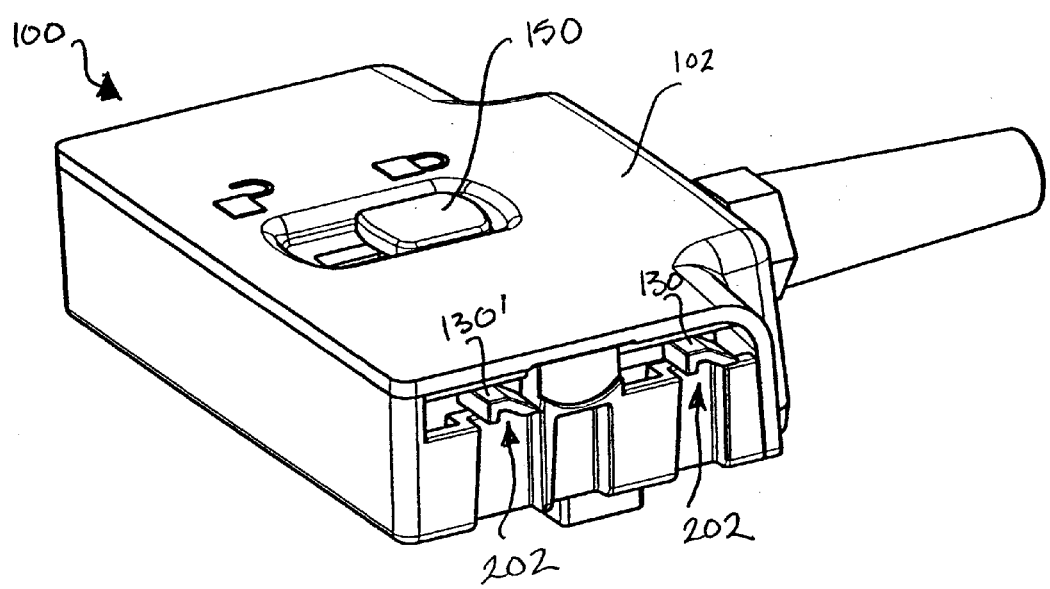
FIG. 5B is a perspective view illustrating the adapter module of FIG. 4, and showing the locking tabs in a closed position.

The assembled adapter module 100 is shown in FIG. 5A with the locking button 150 in the open position and the locking tabs 130 in a retracted position 200. FIG. 5B shows the adapter module with the locking button 150 in the closed position and the locking tabs 130 in an engaged position 202. The locking mechanism will be discussed further hereafter.

Figure 6:
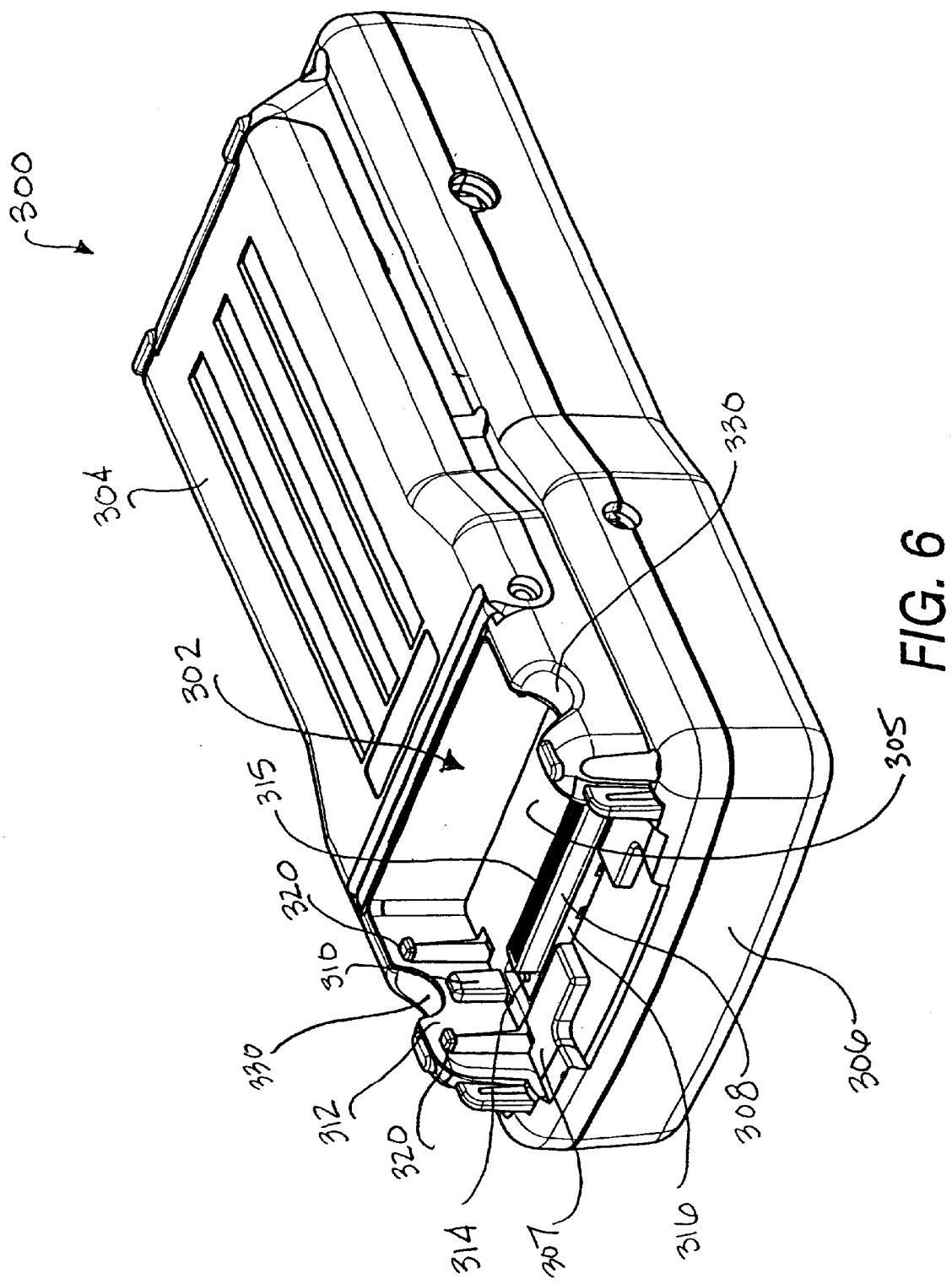
FIG. 6 is a perspective view illustrating a handset module of the invention.

In FIG. 6, a main handset 300 of the testing instrument is shown. The handset 300 includes a housing 306 with a mating adapter well 302 located on one end of an outer surface 304 of the housing 306. The mating adapter well 302 is configured to receive the adapter module 100 previously shown in FIG. 5A. Inside the adapter well 302 and located on a base surface 305 is a mating RF connector 308 for receiving the RF connector 124 on the adapter module 100. In the adapter well 302 there are guide ribs 310 located on inner side surfaces 312 which are configured to engage the guide wells 160 on the adapter housing 102. The mating RF connector 308 includes a connector housing 316 and two mechanical locating pin sockets 314 extending into the connector housing 316. The locating pin sockets 314 define a second mating surface 315 which is substantially perpendicular to the locating pin sockets 314. To facilitate insertion of the adapter module 100, the locating pin sockets 314 align with the locating pins 126 on the RF connector housing 124 of the adapter module 100 to ensure that the RF connectors 124, 308 are properly aligned prior to engagement. Once aligned, the adapter module 100 is completely inserted into the adapter well 302 in the main handset 300 which couples the RF connectors 124, 308 together.

In the adapter well 302 on the main handset 300 there are bosses 320 extending from the inner side surfaces 312 of the adapter well 302. The bosses 320 restrain the locking tabs 130 of the adapter module 100 when the adapter module 100 is inserted in the adapter well 302. The locking tabs 130 are moved into the locking position 202, shown in FIG. 5B, via the locking button 150, which slides the locking tabs 130 underneath the bosses 320. The bosses 320 are then in contact with both the locking tabs 130 and the inner surface 114 of the outer cover 106 of the adapter module 100, thereby securing the adapter module 100 in the adapter well 302 of the main handset 300.

For additional ease of removal of the adapter 100 from the main handset 300, finger access notches 330 are included through the inner side surfaces 312 in the main handset 300 as seen in FIG. 6. The access notches 330 give the user a non-protrusive gripping area for removal of the adapter module 100 from the adapter well 302 on the main handset 300. By providing a gripping area on the adapter housing, no unnecessary strain is placed on the cable or strain relief sleeve 140 to remove the adapter module 100 from the adapter well 302, thereby reducing the chance of damaging the adapter components.

Figure 7:
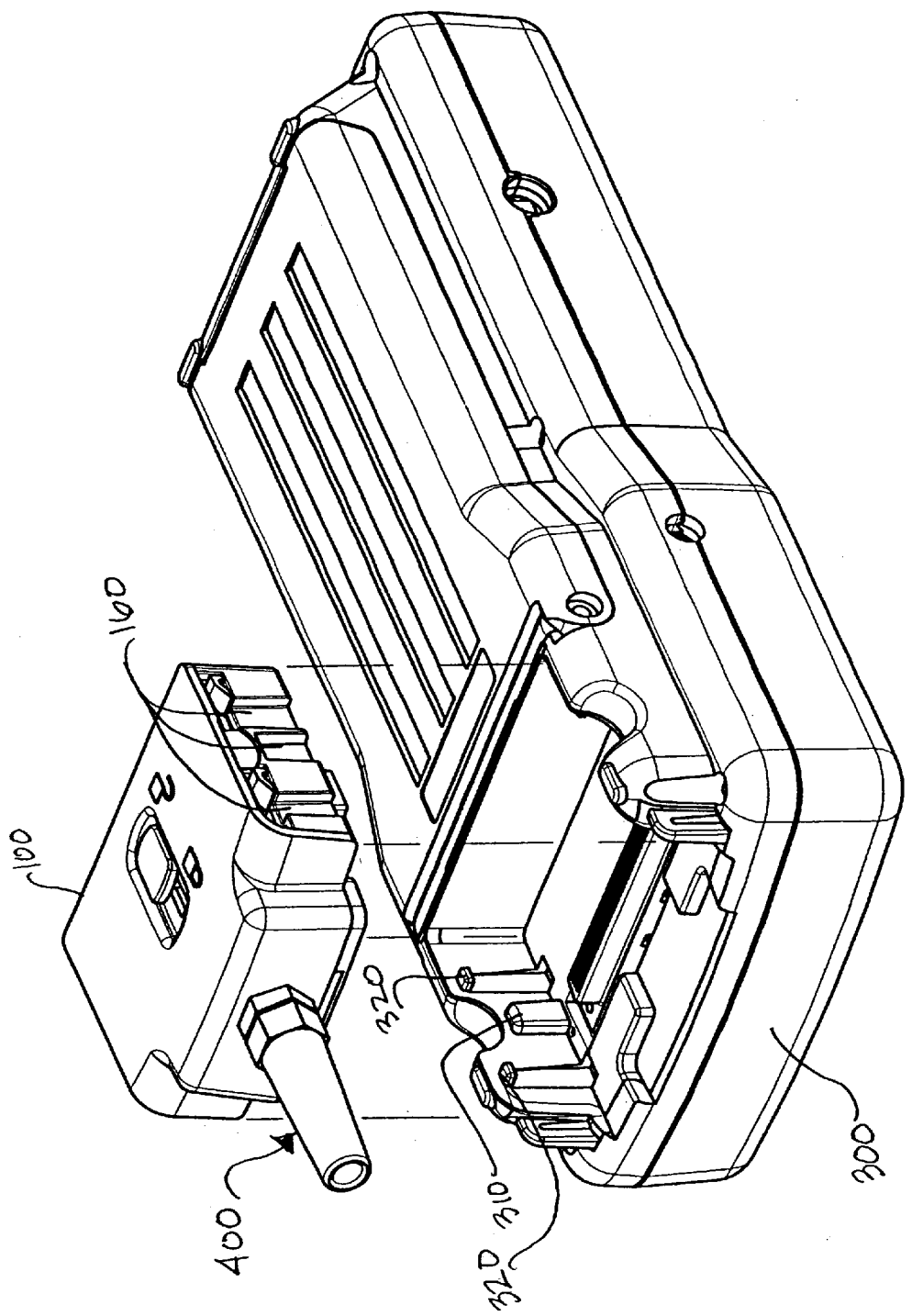
FIG. 7 is a perspective view illustrating the orientation of the adapter module of FIG. 4 during insertion into the handset.

The orientation of insertion of the adapter module 100 into the main handset 300 is shown in FIG. 7. As the adapter module 100 is inserted into the adapter well 302 in the main handset 300, the guide features of the assembly, guide wells 160 on the adapter housing 102 and guide ribs 310 on the main handset 300, ensure proper alignment. The locating pins 126 on the adapter module 100 mate with the pin sockets 314 in the adapter well 302 just prior to the mating of the RF connectors 124, 308 to ensure alignment of the connectors.

Figure 8:
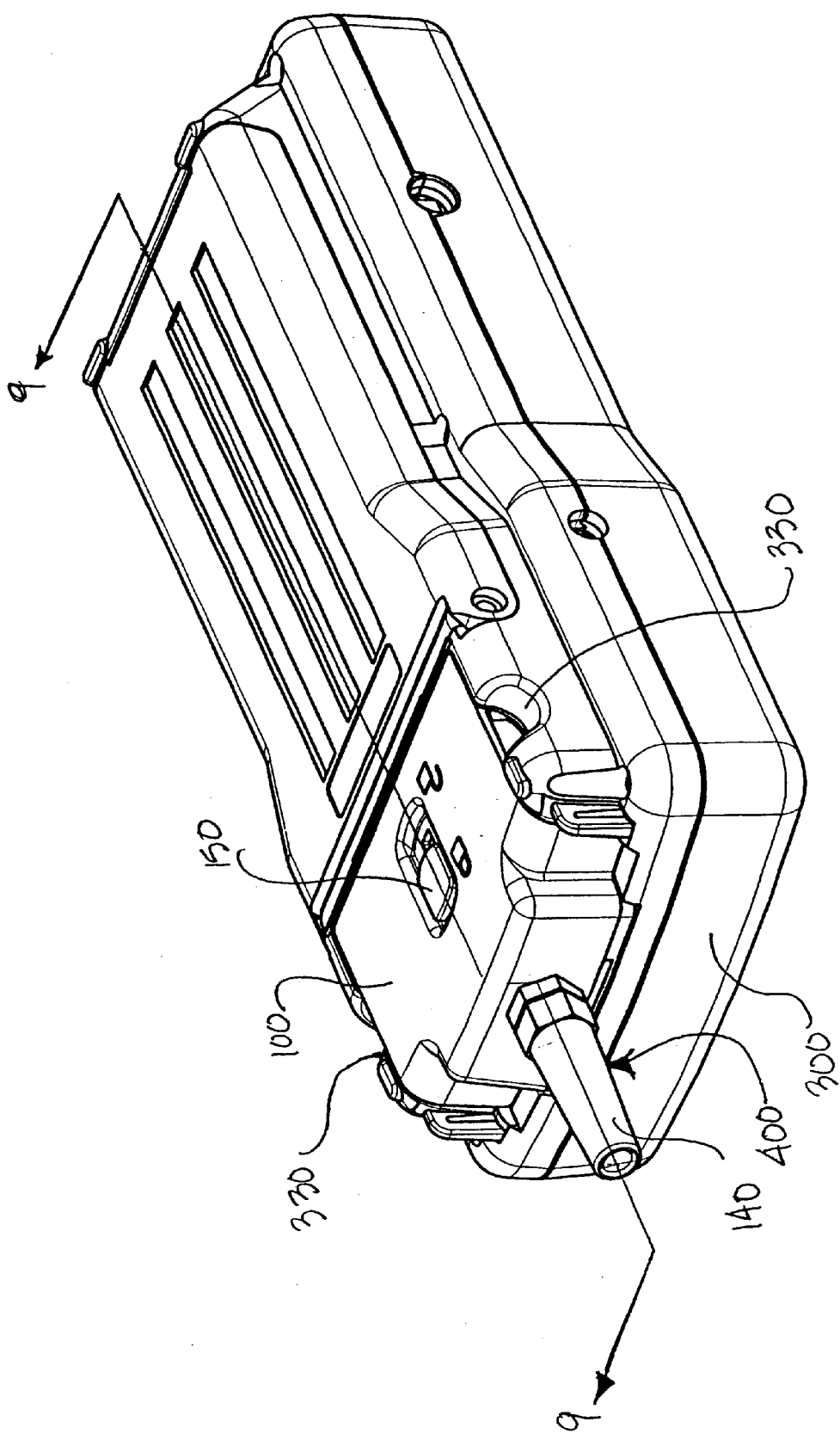
FIG. 8 is a perspective view illustrating the adapter module of FIG. 4 inserted into and locked in the handset module.

The flush design of the total unit is shown in FIG. 8 where the adapter module 100 is fully installed in the main handset 300 and the locking mechanism is engaged with the locking button 150 in the closed position.

As can be seen in FIGS. 7 and 8, the cable connection to the test measurement unit is at a right angle to the direction of insertion of the adapter 100 into the handset 300. Therefore tension on the cable or strain relief sleeve 140 has little effect on the electrical connection contained within the locked housing connection between the adapter module 100 and the main handset 300. The adapter module 100 and the adapter well 302 in the main handset 300 incorporate guide features that pre-align the connector upon insertion of the adapter module 100 into the adapter well 302. These guide features also pre-align the mating RF connectors 124, 308 into proper connection alignment to reduce the possibility of damage to the RF connectors 124, 308 in the case of misalignment. The alignment features include, but are not limited to, mating ribs 310 and locating pins 126 to guide the adapter module 100 into the adapter well 302 on the main handset 300. The alignment features also assist the locking mechanism in stabilizing the adapter module 100 in the adapter well 302.

Figure 9:
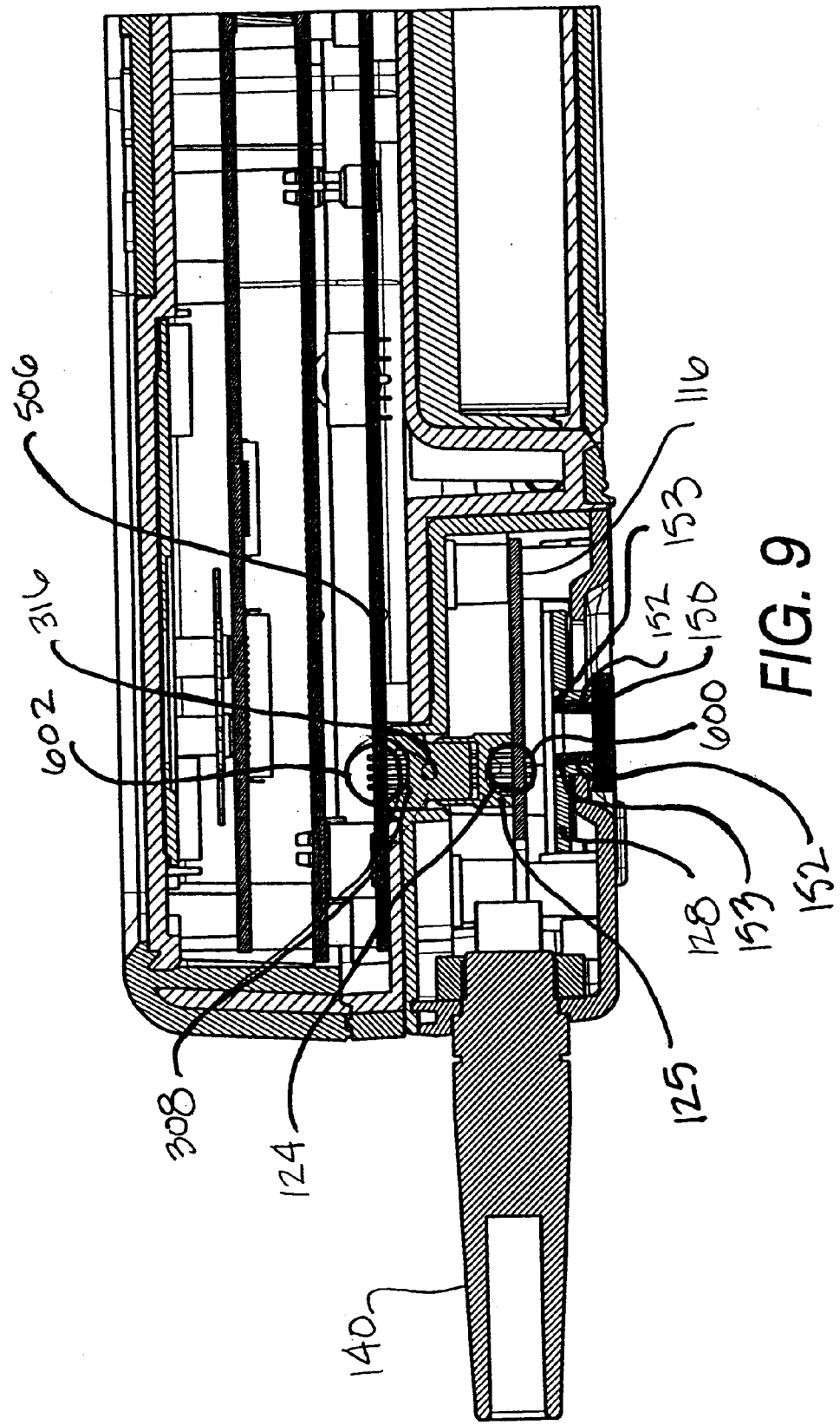
FIG. 9 is a cross-sectional view of the adapter module as locked into the handset module, taken along lines 6—6 of FIG. 8.

FIG. 9 illustrates a cross-sectional view from FIG. 8 of the adapter module 100 and the main housing unit 300 when the two are engaged and locked together. The main handset 300 includes a PCB 506 attached to the RF connector 308 with a malleable material, for example, solder. Thus, the adapter module 100 and handset PCB's 116, 506 are visible in the figure along with their respective RF connectors 124, 308.

As can be seen from the orientation of the connectors 124, 308 for the main handset and adapter module in FIG. 9, the number of right angle turns from one PCB to the other is reduced to just two in this case. The first right angle 600 occurs in the transition from the PCB 116 to the RF connector 124 in the adapter module 100. The second right angle 602 occurs in the transition from the RF connector 308 to the PCB 506 in the main handset 300. It can also be seen that the signal path through the RF connectors 124, 308 is completely shielded from one PCB to the other by the connector housings 125, 316 respectively. By using this straight through connection along with the complete shielding of the connectors, the RF signal measurement error in the test instrument is greatly reduced from that experienced in the prior art.

Figure 10:
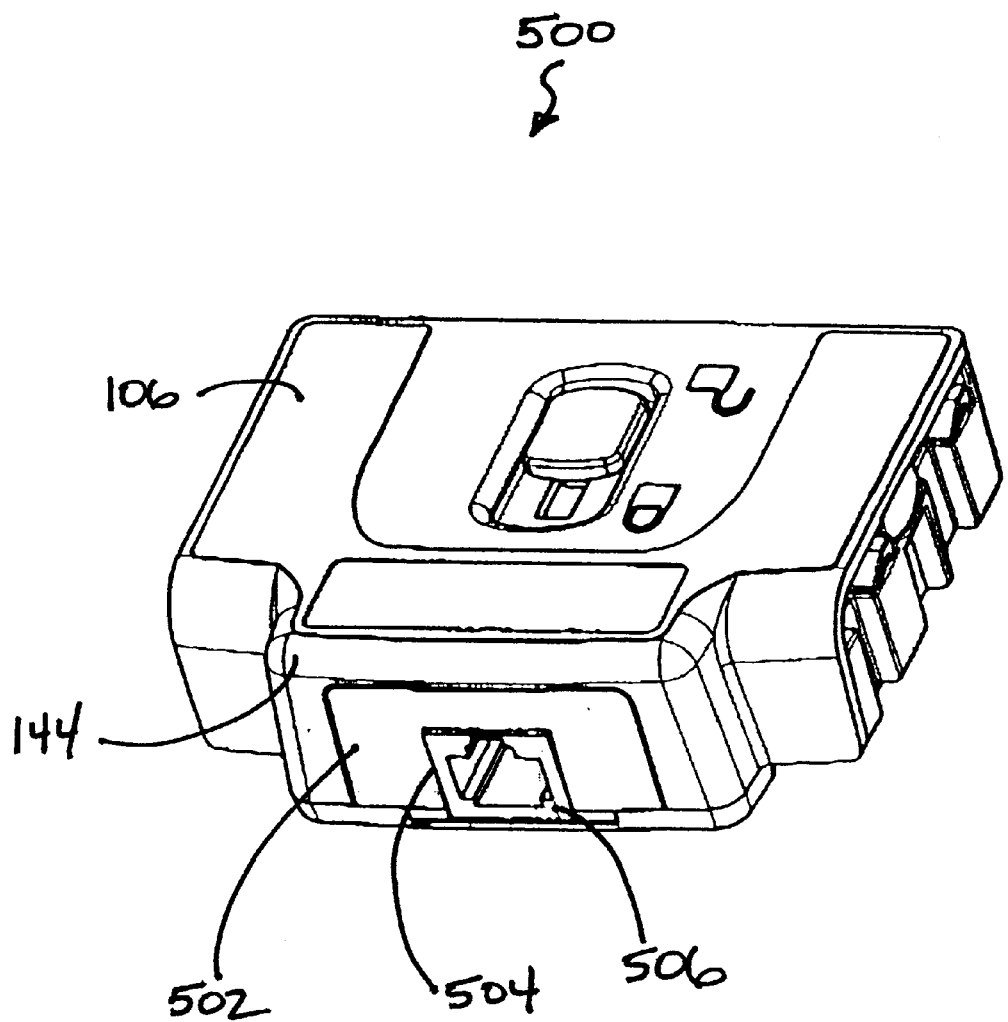
FIG. 10 is a perspective view illustrating an alternate embodiment of the adapter module from FIG. 4, which includes an internal receptacle for receiving a connector plug.

FIG. 10 illustrates an alternate embodiment of an adapter module 500 for use with the main handset 300 of FIG. 6. The adapter module 500 includes a support plate 502 installed in a wall 144 of an outer cover 106. The support plate 502 forms an aperture 504 in the adapter module 500. Installed through the aperture 504 and into the adapter module 500 is a receptacle 506. The receptacle 506 mechanically and electrically connects with the adapter module 500. The receptacle 506 is configured for insertion of a cable test connector plug, for example, an RJ-45 test plug as shown in FIG. 10. In alternate embodiments, the receptacle 506 is configured to receive a BNC coaxial connector or a pair of fiber optic connectors. Further, the adapter module 500 can also include multiple internal receptacles for connection to multiple connector plugs. Alternatively, different internal receptacles, for example, an RJ-45 and BNC receptacles, can be incorporated into the adapter module 500 to allow a single adapter module 500 to connect with different connector plugs.

In alternate embodiments of the invention different types of RF connectors other than straight through connectors are used. An example alternate connector is an edge-wise surface mount connector which connects the signal path straight from one PCB to the other. The use of edge-wise connectors would eliminate all right angle transitions of the electrical signal. However, the types of surface mount edge-wise connectors available commercially are typically less mechanically rugged.

In alternate embodiments of the invention, the adapter module can incorporate cable test connector plugs for different types of cable connections other than the male RJ-45 connector plug, such as a BNC coaxial connector. Having different adapters with different connector capabilities enables the user to test cables with different types of connector plugs using the same handset. The use of an interchangeable adapter module is also advantageous due to the fast wear of the RJ-45 test plug. The adapter PCB assembly is an expendable assembly and can be replaced when the RJ-45 test plug wears out.

In still an additional embodiment of the invention incorporates an EEPROM or other electronic data storage device onto the PCB of the adapter module. The data storage device can store data such as adapter unit identification and calibration data for the specific adapter unit or the type of adapter unit. This data can be accessed by the handset module to provide the calibration of a variety of adapter types of adapter modules.

The mechanical design of the adapter module 100 plugging into the main handset 300 in the manner shown in FIGS. 7 and 8 results in a mated design that is flush with the overall outlines of the handset 300 test instrument. This flush design results in less of a lever arm between the adapter module 100 and the main handset 300. This is because the adapter stacks over or under the measurement PCB instead of mating length-wise. The reduction in lever arm reduces the chances of inducing mechanical strain on the RF connectors 124, and 308. The flush design further improves the overall handling and appearance of the test instrument when the adapter module is installed.

The use of a flush test instrument and the adapter insertion design disclosed herein improves the performance of the equipment by eliminating lever arms and direct strain on the electrical connection between the two modules. The design allows easy interchange of adapters 100 to allow the user to test cables with different types of connector plugs or different characteristics, or quick replacement of an adapter 100 with a worn or faulty connector plug. The straight through electrical connection from one PCB to the other from the adapter module 100 to the main handset 300 improves the accuracy of RF measurements by reducing the number of right angle turns the high frequency signal must propagate through. Also eliminated with the straight through connection is the propagation of the RF signal in free space by eliminating the right angle bend in the connectors that was not shielded in the prior art. The design of the invention greatly improves the performance of the cable test instrument in both the mechanical and electrical areas of reliability.

While a preferred embodiment of the invention has been illustrated and described, it will be appreciated that various changes can be made therein without departing from the spirit and scope of the invention. Those skilled in the art will appreciate that while the preferred embodiment of the test instrument is designed for the testing of LAN cables, the test instrument may also be used for portable testing of cable or networks in other environments.

What is claimed is:

1. A multi-piece, cable test instrument comprising:
   an adapter module having a cable connector located proximate to one end;
   a first printed circuit board connected to the adapter module to form a first wire connection;
   a first connector connected to the first printed circuit board on a first surface of the first printed circuit board, wherein the first connector includes a mating surface which is substantially parallel to the first surface of the first printed circuit board, and wherein there are substantially no bends in an electrical path from the first wire connection to the first mating surface;
   a main instrument housing having an internal recess configured to receive the adapter module;
   a second printed circuit board connected to the housing to form a second wire connection; and
   a second connector connected to the second printed circuit board on a second surface of the second printed circuit board, wherein the second connector includes a second mating surface which is parallel to the second surface, and wherein there are substantially no bends in an electrical path from the second wire connection to the second mating surface, such that the first connector engages the second connector on the first and second mating surfaces upon insertion of the adapter module into the main instrument housing.

2. The test instrument of claim 1, wherein the adapter module forms a substantially continuous outer surface with the main instrument housing when the adapter module is inserted within the main instrument housing.

3. The test instrument of claim 1, wherein the test instrument is hand-held.

4. The test instrument of claim 1, further comprising notches in the housing which define a non-protrusive gripping area for removal of the adapter module from the housing.

5. The test instrument of claim 1, wherein the housing is portable.

6. The test instrument of claim 1, further comprising a guide member between the adapter module and housing, wherein the guide member pre-aligns the first connector with the second connector during insertion of the adapter module into the housing.

7. The test instrument of claim 5, wherein the guide member includes a guide well in the adapter module and a corresponding boss in the housing.

8. The test instrument of claim 5, wherein the guide member includes a guide well in the housing and a corresponding boss in the adapter module.

9. The test instrument of claim 1, further comprising a latching mechanism between the adapter module and the housing, wherein the latching mechanism provides positive retention for the adapter module when inserted in the housing.

10. The test instrument of claim 9, wherein the latching mechanism includes a sliding mechanism.

11. The test instrument of claim 9, wherein the latching mechanism includes a toggling mechanism.

12. The test instrument of claim 9, wherein the latching mechanism extends from the adapter module into the housing.

13. The test instrument of claim 1, wherein the cable connector further comprises a receptacle configured for attachment of a cable test connector plug.

14. The test instrument of claim 13, wherein the cable test connector plug is an RJ-45 plug.

15. The test instrument of claim 13, wherein the cable test connector plug is a BNC coaxial plug.

16. The test instrument of claim 13, wherein the cable test connector plug is a fiber optic plug.

17. The test instrument of claim 1, wherein the cable connector further comprises a cable extending from the adapter module.

18. The test instrument of claim 17, wherein the cable is configured to connect to an interconnect.

19. The test instrument of claim 17, further comprising a connector sleeve extending from the adapter module and around the cable.

20. The test instrument of claim 17, wherein the cable is connected to an RJ-45 connector.

21. The test instrument of claim 17, wherein the cable is connected to a BNC coaxial connector.

22. The test instrument of claim 17, wherein the cable is connected to a fiber optic connector.

23. An adapter module for use with a cable test device comprising:
   a housing configured to mate with the hand-held, cable test instrument;
   an adapter module having a cable connector located proximate to one end of the adapter module;
   a printed circuit board connected to the housing at a first wire connection; and
   a connector connected to the printed circuit board on an attachment surface, wherein the connector includes a mating surface which is substantially parallel to the attachment surface when the connector is attached to the printed circuit board, and wherein there are substantially no bends in an electrical path from the first wire connection to the mating surface.

24. The adapter module of claim 23, wherein the adapter module forms a substantially continuous outer surface with the cable test device when the adapter module is inserted within the cable test device.

25. The adapter module of claim 23, wherein the cable connector further comprises a receptacle configured for attachment of a cable test connector plug.

26. The adapter module of claim 25, wherein the cable test connector plug is an RJ-45 plug.

27. The adapter module of claim 25, wherein the cable test connector plug is a BNC coaxial plug.

28. The adapter module of claim 25, wherein the cable test connector plug is a fiber optic plug.

29. The adapter module of claim 23, wherein the cable connector further comprises a cable extending from the adapter module.

30. The adapter module of claim 29, wherein the cable is configured to connect to an interconnect.

31. The adapter module of claim 29, further comprising a connector sleeve extending from the adapter module and around the cable.

32. The adapter module of claim 29, wherein the cable is connected to an RJ-45 connector.

33. The adapter module of claim 29, wherein the cable is connected to a BNC coaxial connector.

34. The adapter module of claim 29, wherein the cable is connected to a fiber optic connector.

35. A connection configuration for two printed circuit boards comprising:
   a first printed circuit board having a first straight through connector connected to a face of the first circuit board; and
   a second printed circuit board having a second straight through connector connected to a face of the second circuit board, wherein the second straight through connector mates with the first straight through connector, and wherein the first circuit board is parallel to the second circuit board when the first connector is mated with the second connector.

36. The connection configuration of claim 35, wherein the connection configuration is incorporated in a portable testing instrument.

37. A multi-piece, hand-held cable test instrument comprising:
   an adapter module having a cable connector located proximate to one end;
   a first printed circuit board connected to the adapter module;
   a first connector connected to the first printed circuit board, wherein the first connector defines a first mating surface which is substantially parallel to the first printed circuit board;
   a test instrument housing having an internal recess configured to receive the adapter module;
   a second printed circuit board connected to the test instrument housing; and
   a second connector connected to the second printed circuit board, wherein the second connector defines a second mating surface which is substantially parallel to the second printed circuit board, and wherein the first connector engages the second connector on the first and second mating surfaces upon insertion of the adapter module into the test instrument housing.

38. The test instrument of claim 37, further comprising notches in the housing which define a non-protrusive gripping area for removal of the adapter module from the test instrument housing.

39. The test instrument of claim 37, wherein the test instrument housing is portable.

40. The test instrument of claim 37, further comprising a guide member between the adapter module and test instrument housing, wherein the guide member pre-aligns the first connector with the second connector during insertion of the adapter module into the test instrument housing.

41. The test instrument of claim 40, wherein the guide member includes a guide well in the adapter module and a corresponding boss in the test instrument housing.

42. The test instrument of claim 40, wherein the guide member includes a guide well in the test instrument housing and a corresponding boss in the adapter module.

43. The test instrument of claim 37, further comprising a latching mechanism located between the adapter module and the test instrument housing, wherein the latching mechanism provides positive retention of the adapter module when the module is inserted in the test instrument housing.

44. The test instrument of claim 43, wherein the latching mechanism includes a sliding mechanism.

45. The test instrument of claim 43, wherein the latching mechanism includes a toggling mechanism.

46. The test instrument of claim 43, wherein the latching mechanism extends from the adapter module into the test instrument housing.

47. The test instrument of claim 37, wherein the cable connector further comprises a receptacle configured for attachment of a cable test connector plug.

48. The test instrument of claim 47, wherein the cable test connector plug is an RJ-45 plug.

49. The test instrument of claim 47, wherein the cable test connector plug is a BNC coaxial plug.

50. The test instrument of claim 47, wherein the cable test connector plug is a fiber optic plug.

51. The test instrument of claim 37, wherein the cable connector further comprises a cable extending from the adapter module.

52. The test instrument of claim 51, wherein the cable is configured to connect to an interconnect.

53. The test instrument of claim 51, further comprising a connector sleeve extending from the adapter module and around the cable.

54. The test instrument of claim 51, wherein the cable is connected to an RJ-45 connector.

55. The test instrument of claim 51, wherein the cable is connected to a BNC coaxial connector.

56. The test instrument of claim 51, wherein the cable is connected to a fiber optic connector.

57. The test instrument of claim 37, wherein the adapter module forms a substantially continuous outer surface with the test instrument housing when the adapter module is inserted within the test instrument housing.

58. A multi-piece, hand-held cable test instrument comprising:
an adapter module having a cable connector located proximate to one end;
a first connector attached to the adapter module;
a main instrument housing having an internal recess configured to receive the adapter module; and
a second connector configured to mate with the first connector to form a substantially straight electrical path between the adapter module and the main instrument housing.

59. The test instrument of claim 58, further comprising a guide member between the adapter module and main instrument housing, wherein the guide member pre-aligns the first connector with the second connector during insertion of the adapter module into the main instrument housing.

60. A multi-piece cable test instrument comprising:
an adapter module comprising:
a cable connector located proximate to one end;
a first connector having an electrical and mechanical attachment element extending from a first attachment surface thereon, the first connector configured for attachment to a printed circuit board, wherein a first mating surface of the first connector is substantially parallel to the first attachment surface; and
a main instrument comprising:
a housing having an internal recess configured to receive the adapter module;
a second connector having an electrical and mechanical attachment element extending from a second attachment surface thereon and configured for attachment to a printed circuit board, wherein a second mating surface of the second connector is substantially parallel to the second attachment surface, and wherein the first connector engages the second connector on the first and second mating surfaces upon insertion of the adapter module into the housing.

61. The test instrument of claim 60, further comprising a latching mechanism between the adapter module and the housing, wherein the latching mechanism provides positive retention for the adapter module when inserted in the housing.

62. A multi-piece, hand-held cable test instrument comprising:
an adapter module comprising:
a cable connector located proximate to one end;
a first printed circuit board connected to the adapter module;
a first connector fixedly attached to the printed circuit board; and
a main instrument comprising:
a housing having an internal recess configured to receive the adapter module;
a second printed circuit board connected to the main instrument housing;
a second connector fixedly attached to the second printed circuit board and configured to mate with the first connector to form an electrical path between the first and second printed circuit boards, wherein the electrical path is substantially straight in the region between the first and second printed circuit boards.

63. A multi-piece, hand-held cable test instrument comprising:
an adapter module having a cable connector located proximate to one end;
a first connector having an electrical and mechanical attachment element extending from a first attachment surface thereon, the first connector configured for attachment to a printed circuit board, wherein the first connector includes at least one locating pin extending substantially perpendicular to the first printed circuit board to which it can be attached;
a main instrument housing having an internal recess configured to receive the adapter module; and
a second connector having an electrical and mechanical attachment element extending from a second attachment surface thereon, the second connector configured for attachment to a printed circuit board, wherein the second connector mates with the first connector to form an electrical path between the first and second printed circuit boards to which the first and second connectors can be attached, and wherein the electrical path is parallel to the at least one locating pin in the region between the first and second printed circuit boards when the connectors are attached thereon.

64. The test instrument of claim 63, further comprising notches in the housing which define a non-protrusive gripping area for removal of the adapter module from the main instrument housing.

65. A method of manufacturing a multi-piece cable test instrument comprising:

connecting a first printed circuit board having a first surface to a first connector having a first mating surface, such that the first mating surface is substantially parallel to the first surface of the first printed circuit board;

inserting the first printed circuit board and first connector in an adapter housing;

connecting a cable connector to one end of the adapter housing;

connecting a second printed circuit board having a second surface to a second connector having a mating surface, such that the second mating surface is parallel to the second surface of the second printed circuit board;

providing a main instrument housing having an internal recess configured to receive the adapter housing;

inserting the second printed circuit board and the second connector in the main instrument housing, such that the first connector engages the second connector on the first and second mating surfaces upon insertion of the adapter housing into the main instrument housing.

66. The method of claim 65, further comprising forming notches in the main instrument housing which define a non-protrusive gripping area for removal of the adapter module from the main instrument housing.

67. The method of claim 65, further comprising forming a guide well on the adapter housing and a corresponding boss on the main housing.

68. The method of claim 65, further comprising forming a guide well on the main instrument housing and a corresponding boss on the adapter housing.

69. The method of claim 65, wherein connecting the first printed circuit board to the first connector includes forming an electrical connection between the first printed circuit board and the first connector.

70. The method of claim 65, wherein inserting the second printed circuit board and the second connector includes securing the second printed circuit board and the second connector in the main instrument such that the second connector aligns with the first connector upon insertion of the adapter housing into the main instrument housing.

71. A multi-piece cable test instrument comprising:

means for forming a first wire connection between a first printed circuit board having a first surface and a first connector having a first mating surface, such that the first mating surface is substantially parallel to the first surface of the first printed circuit board;

means for inserting the first printed circuit board and first connector in an adapter housing;

means for attaching a cable connector sleeve to the adapter housing, such that the cable connector extends from one end of the housing and defines a cable connection location;

means for forming a second wire connection between a second printed circuit board having a second surface and a second connector having a mating surface, such that the second mating surface is parallel to the second surface of the second printed circuit board;

means for forming a main instrument housing having an internal recess configured to receive the adapter housing;

means for inserting the second printed circuit board and the second connector in the main instrument housing, such that the first connector engages the second connector on the first and second mating surfaces upon insertion of the adapter housing into the main instrument housing.

72. The test instrument of claim 71, further comprising means for guiding the adapter housing into the main instrument housing.

* * * * *